United States Patent
Kawano et al.

(10) Patent No.: US 10,636,985 B2
(45) Date of Patent: Apr. 28, 2020

(54) SUBSTRATE FOR PHOTOELECTRIC CONVERSION ELEMENT

(71) Applicant: JFE STEEL CORPORATION, Chiyoda-ku, Tokyo (JP)

(72) Inventors: Takashi Kawano, Tokyo (JP); Shin Ishikawa, Tokyo (JP); Takuya Murakami, Tokyo (JP)

(73) Assignee: JFE STEEL CORPORATION, Chiyoda-ku, Tokyo (JP)

( * ) Notice: Subject to any disclaimer, the term of this patent is extended or adjusted under 35 U.S.C. 154(b) by 0 days.

(21) Appl. No.: 15/735,689

(22) PCT Filed: Aug. 19, 2016

(86) PCT No.: PCT/JP2016/003792
§ 371 (c)(1),
(2) Date: Dec. 12, 2017

(87) PCT Pub. No.: WO2017/043025
PCT Pub. Date: Mar. 16, 2017

(65) Prior Publication Data
US 2018/0358565 A1    Dec. 13, 2018

(30) Foreign Application Priority Data

Sep. 7, 2015 (JP) ................................. 2015-176037

(51) Int. Cl.
*H01L 51/00* (2006.01)
*H01L 51/44* (2006.01)
(Continued)

(52) U.S. Cl.
CPC .......... *H01L 51/0096* (2013.01); *C23C 22/00* (2013.01); *C25D 9/06* (2013.01);
(Continued)

(58) Field of Classification Search
CPC ............. H01L 51/0096; H01L 51/0097; H01L 51/4253; C23C 22/00; C23C 18/1241; C25D 9/10; C25D 11/34; Y02E 10/549
See application file for complete search history.

(56) References Cited

U.S. PATENT DOCUMENTS 8,961,713 B2    2/2015 Yamada et al.
2010/0300527 A1  12/2010 Okamura et al.
(Continued)

FOREIGN PATENT DOCUMENTS

CN    102026743 A    4/2011
CN    102460720 A    5/2012
(Continued)

OTHER PUBLICATIONS

Dec. 14, 2018, Office Action issued by the Korean Intellectual Property Office in the corresponding Korean Patent Application No. 10-2018-7002755 with English language concise statement of relevance.
(Continued)

*Primary Examiner* — Daniel J. Schleis
*Assistant Examiner* — Kevin C T Li
(74) *Attorney, Agent, or Firm* — Kenja IP Law PC

(57) ABSTRACT

Disclosed is a substrate for a photoelectric conversion element that is low in cost as compared with a conventional ITO/glass substrate, easy to handle, and does not lower the power generation performance of the solar cell. The substrate for a photoelectric conversion element is made of a stainless steel sheet having a passive film on a surface thereof, an atomic ratio Cr/(Fe+Cr) of the passive film on a surface thereof is 0.08 or more.

2 Claims, 1 Drawing Sheet

(51) Int. Cl.
  *C23C 22/00*  (2006.01)
  *C25D 9/10*  (2006.01)
  *C25D 9/06*  (2006.01)
  *C25D 11/34*  (2006.01)
  *H01L 51/42*  (2006.01)
  *C23C 18/12*  (2006.01)

(52) U.S. Cl.
  CPC ............... *C25D 9/10* (2013.01); *C25D 11/34* (2013.01); *H01L 51/0097* (2013.01); *H01L 51/44* (2013.01); *C23C 18/1216* (2013.01); *C23C 18/1241* (2013.01); *C23C 18/1254* (2013.01); *H01L 51/4253* (2013.01); *Y02E 10/549* (2013.01)

(56) References Cited

U.S. PATENT DOCUMENTS

2011/0294042 A1* 12/2011 Kim ..................... C22C 38/001
  429/516
2012/0306040 A1  12/2012 Yuya et al.

FOREIGN PATENT DOCUMENTS

| DE | 10257165 A1 | | 6/2004 |
|---|---|---|---|
| EP | 1420460 A2 | | 5/2004 |
| GB | 2117971 A | | 10/1983 |
| JP | 06306611 A | * | 11/1994 |
| JP | H06306611 A | | 11/1994 |
| JP | 2011035258 A | | 2/2011 |
| JP | 2012514297 A | | 6/2012 |
| JP | 2012169479 A | | 9/2012 |
| JP | 2012201950 A | * | 10/2012 |
| JP | 2012201950 A | | 10/2012 |
| KR | 1020120022905 A | | 3/2012 |
| WO | 2015033088 A1 | | 3/2015 |

OTHER PUBLICATIONS

Aug. 2, 2018, the Extended European Search Report issued by the European Patent Office in the corresponding European Patent Application No. 16843898.4.

Aug. 29, 2017, Notification of Reasons for Refusal issued by the Japan Patent Office in the corresponding Japanese Patent Application No. 2016-567282 with English language Concise Statement of Relevance.

Oct. 11, 2016, International Search Report issued in the International Patent Application No. PCT/JP2016/003792.

Aug. 5, 2019, Office Action issued by the China National Intellectual Property Administration in the corresponding Chinese Patent Application No. 201680045008.7 with English language search report.

Oct. 1, 2019, Office Action issued by the Korean Intellectual Property Office in the corresponding Korean Patent Application No. 10-2018-7002755 with English language concise statement of relevance.

Feb. 3, 2020, Office Action issued by the China National Intellectual Property Administration in the corresponding Chinese Patent Application No. 201680045008.7 with English language search report.

* cited by examiner

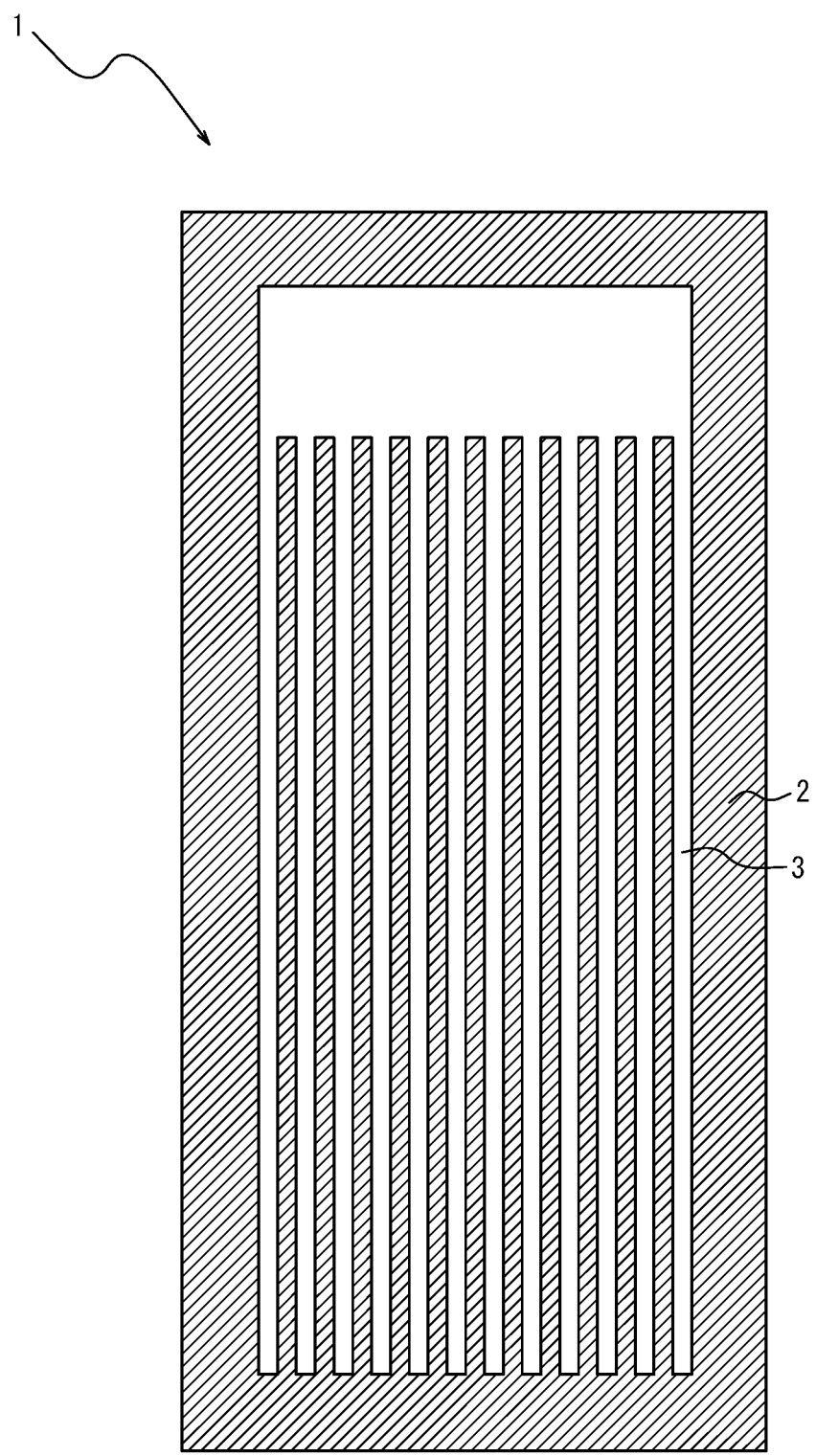

SUBSTRATE FOR PHOTOELECTRIC CONVERSION ELEMENT

TECHNICAL FIELD

This disclosure relates to a substrate used for a photoelectric conversion element, particularly for an organic thin-film solar cell.

BACKGROUND

Development of technology related to utilization of solar energy, which is a clean, non-exhaustible resource, is indispensable for solving present and future energy problems. Among others, organic thin-film solar cells have advantages of lower material and manufacturing costs than other potential solar cells such as silicon-based solar cells, and are expected as promising candidates for solar cells.

However, organic thin-film solar cells have a problem that the power generation efficiency is low as compared with solar cells of other type already in practical use. Therefore, there are demands for improving power generation efficiency for practical application of organic thin-film solar cells. In addition, in order to widely put organic thin-film solar cells into practical use, it is necessary to further reduce material and manufacturing costs from the viewpoint of compensating for their low power generation efficiency.

Glass substrates are usually used as the base material of organic thin-film solar cells. However, glass substrates account for not a small part of the material cost of organic thin-film solar cells. Glass substrates also require special care for handling so as not to be broken during manufacture, transportation, or installation. Moreover, glass substrates are used while being held in a metal frame or a casing, and additional costs are incurred accordingly. Glass substrates also have transparent electrodes formed on their surface, and ITO (Indium Tin Oxide) is mainly used as the material of such transparent electrodes. ITO is not only expensive but also the price is unstable as it contains indium which is a rare metal. For these reasons, it is difficult to reduce the manufacturing cost of organic thin-film solar cells using glass substrates.

To address these issues, various techniques have been examined for using substrates made of less expensive materials instead of glass substrates. For example, a conventional technique proposes a substrate using a plastic material such as PET (PolyEthylene Terephthalate) as a base material. JP201135258A (PTL 1) describes a technique of using an aluminum substrate instead of a conventional ITO/glass substrate.

CITATION LIST

Patent Literature

PTL 1: JP201135258A

SUMMARY

Technical Problem

However, even when a plastic substrate is used as the base material, a drastic cost reduction is difficult to achieve if the substrate has a large area, which requires a support body to support the substrate. In the case of using an aluminum substrate, it is not necessarily possible to obtain power generation performance stably equivalent to those obtained by using a conventional ITO/glass substrate.

It could thus be helpful to provide a substrate for a photoelectric conversion element that is low in cost, easy to handle as compared to a conventional ITO/glass substrate, and does not lower the power generation performance of the solar cell.

Solution to Problem

To solve the above issues, we conducted intensive studies on substrate materials that replace conventional glass substrates and transparent electrodes. As a result, we reached the following findings:
(1) When a stainless steel sheet is used as the substrate, cost can be reduced and handling becomes easy as compared with the case of using a conventional ITO/glass substrate.
(2) By increasing the Cr ratio on the surface of the passive film of the stainless steel sheet, excellent power generation performance can be obtained.

Based on these findings, we conducted further investigation which eventually led to the present disclosure.

We provide the following:
1. A substrate for a photoelectric conversion element, the substrate being made of a stainless steel sheet having a passive film on a surface thereof, wherein an atomic ratio Cr/(Fe+Cr) of the passive film on a surface thereof is 0.08 or more.
2. The substrate for a photoelectric conversion element according to 1., wherein the passive film has a thickness of less than 2.3 nm.
3. The substrate for a photoelectric conversion element according to 1. or 2., wherein an arithmetic mean roughness Ra of the substrate for the photoelectric conversion element on a surface thereof is less than 10 nm.

Advantageous Effect

According to the present disclosure, it is possible to provide a substrate for a photoelectric conversion element that is low in cost as compared to a conventional ITO/glass substrate, easy to handle, and does not lower the power generation performance of the solar cell. The substrate for photoelectric conversion element disclosed herein can be suitably used for a photoelectric conversion element such as an organic thin-film solar cell, and for a photovoltaic power generation module using the element.

BRIEF DESCRIPTION OF THE DRAWING

The FIGURE is a schematic diagram illustrating an arrangement of an Au electrode as a collector electrode.

DETAILED DESCRIPTION

The substrate for a photoelectric conversion element disclosed herein (which may also be simply referred to as "substrate") is made of a stainless steel sheet having a passive film on a surface thereof. An atomic ratio Cr/(Fe+Cr) of the passive film on a surface thereof is 0.08 or more. The following provides details of the substrate for a photoelectric conversion element.

<Stainless Steel Sheet>

The substrate for a photoelectric conversion element disclosed herein is made of a stainless steel sheet. Using a stainless steel sheet which is a metallic material, the substrate according to the disclosure can have rolls of a structural member to mechanically support the photoelectric conversion element and of a collector electrode which is a component of the photoelectric conversion element.

Glass substrates used as the base material in conventional organic thin-film solar cells generally have high strength but poor toughness, and care must be taken in handling during manufacture, transportation, and installation. In addition, glass substrates are difficult to handle even as a support itself, and are thus used while being held in a metal frame or a casing. In the case of using a plastic substrate such as a PET substrate instead of a glass substrate, some substrate is required at the time of installation because the strength of the substrate itself is weak.

In contrast, stainless steel which is a metallic material has both strength and toughness, exhibits excellent corrosion resistance, and is thus advantageous in terms of functioning as a structural material, particularly when used as the base material of a photoelectric conversion element. Stainless steel is also advantageous from the perspectives of raw material cost and manufacturing cost, as compared with glass, plastic, and other metallic materials such as aluminum and titanium.

The thickness of the stainless steel sheet is not particularly limited and may be selected according to the required performance and the like. In the case of using a thin stainless steel sheet (such as a stainless steel foil), strength decreases, yet the steel sheet is advantageous for its excellent lightness and flexibility. On the other hand, in the case of using a thick stainless steel sheet, weight increases, yet the steel sheet may be used without problems depending on the application. From the viewpoint of ease of handling, it is preferable to set the thickness of the stainless steel sheet to 0.1 mm or more and 2.0 mm or less. More preferably, the thickness is set to 0.2 mm or more. Further, the thickness is more preferably 1.5 mm or less, and still more preferably 1.0 mm or less.

From the viewpoints of corrosion resistance and the formation of a passive film having a high Cr atomic ratio described later, the Cr content of the stainless steel sheet is preferably 13 mass % or more, and more preferably 16 mass % or more. On the other hand, if the Cr content exceeds 20 mass %, the cost increase becomes noticeable. Thus, the Cr content is preferably 20 mass % or less.

In addition, low C content of the stainless steel sheet is preferable from the viewpoint of corrosion resistance. The C content is preferably 0.12 mass % or less, and more preferably 0.08 mass % or less. On the other hand, excessively reducing the C content lowers the productivity and increases the production costs. Therefore, it is preferable to set the C content to 0.002 mass % or more, and more preferably to 0.005 mass % or more.

In particular, when high corrosion resistance is required, at least one additional element selected from the group consisting of Ti, Nb, and Mo may be optionally contained in the stainless steel sheet. When Ti is added, the Ti content is preferably 1.0 mass % or less. When Nb is added, the Nb content is preferably 1.0 mass % or less. When Mo is added, the Mo content is preferably 3.0 mass % or less. On the other hand, since Ti, Nb, and Mo are optional elements, the lower limit of their contents may be zero, but from the viewpoint of improving the corrosion resistance, it is preferable to set the Ti content to 0.01 mass % or more, the Nb content to 0.01 mass % or more, and the Mo content to 0.1 mass % or more.

From the viewpoint of electric resistance, it is preferable to use ferritic stainless steel as the stainless steel.

<Passive Film>

The surface of stainless steel is usually covered with a passive film made of a stable oxide or the like, and such stainless steel has excellent corrosion resistance. In this disclosure, it is important not only that the stainless steel sheet used for the substrate for a photoelectric conversion element merely has a passive film, but that an atomic ratio Cr/(Fe+Cr) of the passive film on a surface thereof is 0.08 or more.

A passive film is also formed on the surface of an as-manufactured stainless steel sheet or a stainless steel sheet polished in an atmospheric environment. However, the surface of such a passive film is mainly composed of an Fe-based oxide or hydroxide, and its electrical conductivity is low because of low Cr content. Therefore, when such an ordinary stainless steel sheet is used as a substrate for a photoelectric conversion element, good power generation performance cannot be obtained.

In contrast, in the substrate disclosed herein, by increasing the atomic ratio Cr/(Fe+Cr) in the outermost surface of the passive film as high as 0.08 or more, it is possible to improve the electrical conductivity on the substrate surface and the performance of the photoelectric conversion element. The atomic ratio Cr/(Fe+Cr) is preferably 0.10 or more, more preferably 0.15 or more, still more preferably 0.18 or more, and most preferably 0.20 or more. On the other hand, the electrical conductivity increases with increasing atom number ratio Cr/(Fe+Cr), and the upper limit thereof is not particularly limited. However, when Cr/(Fe+Cr) is increased, a Cr-rich new oxidation phase is generated, which may lower the electrical conductivity. Therefore, Cr/(Fe+Cr) is preferably 0.90 or less, and more preferably 0.70 or less. The value of the atomic ratio Cr/(Fe+Cr) can be measured by the method described in the Examples.

The thickness of the passive film is not particularly limited and may be any thickness, yet it is preferably less than 2.3 nm. The thickness of the passive film varies depending on the manufacturing history of the stainless steel sheet. However, in the case of a stainless steel sheet as manufactured under general conditions or a stainless steel sheet polished in an atmospheric environment, the thickness of the passive film may be greater than 3.0 nm. Therefore, if the thickness of the passive film is less than 2.3 nm, the electrical conductivity on the substrate surface can be further improved, and the performance of the photoelectric conversion element using the substrate can be further improved. The thickness of the passive film is more preferably 2.2 nm or less, and still more preferably 2.1 nm or less. On the other hand, no particular lower limit is placed on the thickness of the passive film, yet the lower limit is preferably 0.8 nm, and more preferably 1.0 nm, from the perspective of providing sufficient protection as a passive film. The thickness of the passive film can be measured by the method described in the Examples.

The method for obtaining the above passive film is not particularly limited, and any method may be used. For example, surface treatment in an acidic environment may be used. Examples of such surface treatment in an acidic environment include modifying a passive film formed in the atmosphere on the surface of a stainless steel sheet by dipping in an acidic solution, cathodic electrolytic treatment in an acidic solution, anodic dissolution treatment, or the like.

<Arithmetic Mean Roughness Ra>

Furthermore, in the substrate for a photoelectric conversion element according to the disclosure, an arithmetic mean roughness Ra of the substrate for the photoelectric conversion element on a surface thereof is preferably less than 10 nm. In forming a photoelectric conversion element, layers having various functions are formed on the surface of the substrate. When the roughness of the substrate surface is high, however, the thickness of the layer formed on the substrate tends to be non-uniform, and the performance of the photoelectric conversion element may become unstable. When the roughness of the substrate surface is high, the risk of occurrence of a short circuit through a convex portion of the substrate surface also increases. Therefore, Ra is preferably less than 10 nm, more preferably 9.5 nm or less, and still more preferably 9.0 nm or less. Methods for obtaining a substrate for a photoelectric conversion element having Ra of less than 10 nm include, for example, surface-polishing a stainless steel sheet or rolling a stainless steel sheet using a low-roughness roll. From industrial viewpoint, rolling using a low-roughness roll is preferable from the productivity perspective. On the other hand, as lower Ra is preferable, no particular lower limit is placed on Ra. However, excessively reducing Ra causes saturation of the effect obtained by reducing Ra and leads to increased manufacturing costs. Therefore, Ra is preferably 1 nm or more, and more preferably 2 nm or more. The arithmetic mean roughness Ra on the surface of the substrate for a photoelectric conversion element can be measured by the method described in the Examples.

<Photoelectric Conversion Element>

The substrate according to the disclosure can be used as a substrate for any photoelectric conversion elements. Among others, it is preferably used as a substrate for an organic solar cell, and more preferably as a substrate for an organic thin-film solar cell. Hereinafter, one of the embodiments of the disclosure will be described with reference to a case where the substrate according to the disclosure is used for an organic thin-film solar cell. However, the disclosure is not limited to the embodiments disclosed herein, and the substrate according to the disclosure can be used not only for organic thin-film solar cells but also for general photoelectric conversion elements having similar forms, such as dye-sensitized solar cells and photodiodes, in which case the effect of the disclosure can be still obtained.

<Organic Thin-Film Solar Cell>

The organic thin-film solar cell produced using the substrate according to the disclosure (hereinafter also referred to as "the stainless substrate") is not limited to a particular structure and may be of any structure. However, the organic thin-film solar cell comprises, at least, a stainless substrate that functions as a first electrode, an organic power generation layer that comprises an organic semiconductor, and a second electrode. Preferably, the organic thin-film solar cell further comprises at least one set of an electron collection layer and a hole collection layer. The order of stacking these layers is not particularly limited, yet, for example, an electron collection layer, an organic power generation layer, a hole collection layer, and a second electrode may be stacked in the stated order from the stainless substrate side. In the organic thin-film solar cell with these layers stacked in this order, the stainless substrate functions as a cathode and the second electrode as an anode.

The organic thin-film solar cell may have a structure in which one set (one layer each) of an electron collection layer, an organic power generation layer, and a hole collection layer is stacked. Alternatively, the organic thin-film solar cell may have a so-called tandem-type structure in which two or more sets of these layers are stacked.

<<Electron Collection Layer>>

The electron collection layer is usually provided between the anode and the organic power generation layer, and has a function of efficiently guiding electrons from the organic power generation layer to the anode. If no electron collection layer is present and the anode and the organic power generation layer are directly stacked on top of each other, it is impossible to effectively extract electrons from the organic power generation layer, and the electric power that can be taken out of the system is markedly reduced compared to the supposedly generated electric power. Therefore, it is preferable to provide the electron collection layer.

The material constituting the electron collection layer is not particularly limited, yet an n-type semiconductor is preferably used. Examples of the n-type semiconductor include titanium oxide and zinc oxide. These n-type semiconductors may be used alone or in combination of two or more. In particular, when a stainless substrate is used as an anode and an electron collection layer is formed thereon, better power generation performance can be obtained by using zinc oxide as the material of the electron collection layer. As used herein, the term "zinc oxide" refers to both ZnO and $ZnO_{1-x}$ having a slight O deficiency.

When zinc oxide is used as the material of the electron collection layer, the electron collection layer can be formed by any method such as a sol-gel method. In the case of using a sol-gel method, it is preferable to perform heat treatment at a temperature of about 130° C. to about 300° C. so that no solvent or moisture remains after film formation. Preferably, the thickness of the electron collection layer is in the range of 30 nm to 100 nm. The electron collection layer may also contain other substances than zinc oxide without impairing the effect of the disclosure, as long as the content of other substances is generally less than 5 mass %.

The reason why zinc oxide is preferable as the material of the electron collection layer is considered to be related to ultraviolet rays contained in sunlight as described below. In a conventional organic thin-film solar cell, a transparent material such as glass is used as the substrate, and irradiation with sunlight is performed from the substrate side. In contrast, the substrate according to the disclosure does not transmit sunlight, and in the organic thin-film solar cell using the substrate disclosed herein, irradiation with sunlight is performed from the side opposite to the substrate. Accordingly, in the organic thin-film solar cell having the above-described structure, the sunlight reaching the electron collection layer is the light that has passed through the organic power generation layer and the hole collection layer, in the course of which ultraviolet components contained in the sunlight are absorbed. While the reason is unclear, in the case of using titanium oxide as the electron collection layer, for example, the power generation performance may be deteriorated if the amount of ultraviolet light components contained in the sunlight reaching the electron collection layer is small. On the other hand, when zinc oxide is used as the material of the electron collection layer, good power generation performance can be obtained even with a small amount of ultraviolet components.

However, when the zinc oxide is treated at high temperature, the above performance may not be obtained in some cases. Therefore, in order to stably obtain favorable power generation performance, it is preferable to perform the aforementioned heat treatment at 130° C. to 300° C. at the time of forming the electron collection layer using zinc oxide. The effect of this temperature is presumed to be due to the difference in crystallinity of zinc oxide.

<<Organic Power Generation Layer>>

The organic power generation layer may be of any type as long as it is an organic power generation layer having an organic semiconductor. However, from the viewpoint of power generation efficiency, it is preferable to use a bulk heterojunction-type organic power generation layer that is composed of an electron acceptor and an electron donor. As the bulk heterojunction-type organic power generation layer, for example, a mixed layer of P3HT (polythiophene derivative: poly(3-hexylthiophene)), which is a p-type organic semiconductor, and PCBM (fullerene derivative: [6,6]-phenyl-C61-butyric acid methyl ester), which is an n-type organic semiconductor, may be used. In that case, from the viewpoint of obtaining good power generation efficiency, it is preferable to set the thickness of the organic power generation layer within the range of 70 nm to 300 nm.

<<Hole Collection Layer>>

The hole collection layer is usually provided between the organic power generation layer and an electrode functioning as a cathode, and has a function of efficiently guiding holes from the organic power generation layer to the cathode. The material constituting the hole collection layer is not particularly limited, yet PEDOT:PSS (poly (3,4-ethylenedioxythiophene):poly(4-styrene sulfonic acid)), which is a conductive polymer, may be used.

The configurations of the electron collection layer, the organic power generation layer, and the hole collection layer are not limited to the above. That is, if the above configurations are replaced by those with higher photoelectric conversion efficiency, the effect of the disclosure is not impaired. The effect of the disclosure is increased by, for example, replacing the material with one having higher photoelectric conversion efficiency in the future.

<<Second Electrode>>

As described above, in an organic thin-film solar cell using a stainless substrate as the first electrode, since light cannot be incident from the stainless substrate side, light is directed to enter from the second electrode side. Accordingly, the second electrode should not significantly inhibit the incidence of light into the organic power generation layer. Therefore, the second electrode may be a material generally used as a transparent electrode such as ITO. The second electrode may also be a metal electrode that is provided as an extremely thin layer or as a structure having an opening such as a mesh or a slit. This setup may prevent the metal electrode from significantly inhibiting the incidence of light into the organic power generation layer. In addition, the effect of the disclosure is not impaired if the surface, the side surface, and the back surface of the organic thin-film solar cell are coated or painted for the purpose of protection, for example, as long as the coating or painting does not significantly inhibit the incidence of light into the organic power generation layer.

EXAMPLES

Examples of the disclosure will be specifically described below. The following examples merely represent preferred examples, and the disclosure is not limited to these examples. Various modifications can be made to the disclosed embodiments as deemed appropriate without departing from the intent and scope of the disclosure, and all such modifications are to be embraced within the technical scope thereof.

Substrates for photoelectric conversion elements made of stainless steel sheets and organic thin-film solar cells using the corresponding substrates were prepared, and their performances were evaluated. For comparison, an organic thin-film solar cell using a conventional glass substrate was prepared and evaluated. The production procedures and the evaluation method for the substrates and the organic thin-film solar cells will be described below.

<Substrate>

Stainless steel sheets (SUS430) A to C in Table 1 were used as blank sheets to produce substrates for organic thin-film solar cells. Blank sheet A is a steel sheet produced through low-roughness rolling, blank sheet B is a steel sheet whose surface was mirror-finished by electrolytic abrasive polishing, and blank sheet C is a steel sheet produced under general rolling conditions. The thickness and the arithmetic mean roughness Ra of each blank sheet are as presented in Table 1. From each of blank sheets A to C, two substrates, each having a size of 2.5 cm×4.0 cm, were produced. For each set of substrates, one was used as produced, while the other being used after surface treatment for controlling the atomic ratio of Cr on the surface. As the surface treatment, an electrolysis treatment was carried out at −5 A/dm$^2$ for one second in 3% sulfuric acid. Each substrate was cleaned with 2-propanol, and then used for production of an organic thin-film solar cell. It was found that the Ra of each obtained substrate was the same as that of the blank sheet used.

<Organic Thin-Film Solar Cell Using Stainless Substrate>

<<Electron Collection Layer>>

A zinc oxide precursor was prepared by dissolving 0.35 mol/L of zinc bisacetylacetonate in a mixed solvent of 2-methoxyethanol containing 10.6 mass % of acetylacetone, and was spin-coated on a stainless substrate. Immediately thereafter, the substrate was heated at 250° C. for 1 hour to form a zinc oxide layer on the stainless substrate. The thickness of the zinc oxide layer was about 60 nm.

<<Organic Power Generation Layer>>

P3HT (polythiophene derivative: poly(3-hexylthiophene)) and PCBM (fullerene derivative: [6,6]-phenyl-C61-butyric acid methyl ester) were mixed at a mass ratio of 5:4, and the mixture was dissolved in chlorobenzene to form a solution so that its concentration was 3.9 mass %. The solution was spin-coated on the zinc oxide layer as an electron collection layer, and dried at room temperature for 30 minutes or more to form an organic power generation layer. The conditions for spin coating were set so that the thickness of the organic power generation layer after drying was about 200 nm.

<<Hole Collection Layer>>

An aqueous dispersion containing a total of 1.3 mass % of commercially available PEDOT (poly(3,4-ethylenedioxythiophene)) and PSS (poly(4-styrene sulfonic acid)), at a mass ratio of 1:2.5, was prepared. The aqueous dispersion was spin-coated on the organic power generation layer and dried to form a hole collection layer. The conditions for spin coating were set so that the thickness of the hole collection layer after drying was about 190 nm.

<<Collector Electrode (Second Electrode)>>

A slit-shaped Au electrode having one end connected was produced as a collector electrode on the hole collection layer. Specifically, the hole collection layer was covered with a stainless steel mask in which slit-shaped openings having a width of about 0.5 mm were arranged at spaces of about 0.5 mm, Au was deposited in a vacuum bell jar, and then additional Au was deposited in a band shape so as to traverse the slit rows formed with Au near their one ends so that each slit is electrically connected. In this way, a slit-like Au deposited film was formed as illustrated in the FIGURE. The thickness of the deposited Au layer was about 100 nm. Then, as a protective film, a polymer film (CELLEL® R1150 gas barrier sheet with a film thickness of 100 µm, manufactured by Kureha Extech Co., Ltd.) was pressure bonded to the surface on which the collector electrode was formed to obtain an organic thin-film solar cell.

<Organic Thin-Film Solar Cell Using Glass Substrate>

For comparison, an organic thin-film solar cell was produced using as a substrate a commercially available glass plate (a glass plate manufactured by Kuramoto Co., Ltd., with a thickness of 1 mm, ITO thickness of about 200 nm, and sheet resistance of about 5 Ω/sq). Specifically, the glass plate was cut into a size of 2.5 cm×4.0 cm, cleaned with 2-propanol, and then under the same conditions as the organic thin-film solar cell using the above stainless substrate, an electron collection layer, an organic power generation layer, a hole collection layer, and a collector electrode, as well as a protective film were formed thereon, thereby forming an organic thin-film solar cell.

<Arithmetic Mean Roughness Ra>

The arithmetic mean roughness Ra of the surface of each of the stainless steel sheets A to C used as the blank sheets were measured. The measurement was carried out using a stylus-type surface roughness meter in accordance with the standard JIS B 0601. The cutoff value λc was set to 0.25 mm, and evaluation was made by averaging the results from measuring the surface roughness five times for each stainless steel sheet along a direction perpendicular to the rolling direction of the stainless steel sheet. The measurement results are as listed in Table 1. As described above, the Ra of the substrate after subjection to the surface treatment for controlling the atomic ratio of Cr was determined to be the same as that of the blank sheet.

<Atomic Ratio Cr/(Fe+Cr) and Thickness of Passive Film>

For each of the stainless steel sheets used as the substrates in specimen Nos. 1 to 6, the atomic ratio Cr/(Fe+Cr) on the surface of the passive film was measured. The measurement was carried out by depth direction analysis with AES (Auger electron spectroscopy), and the atomic ratio Cr/(Fe+Cr) on the outermost surface of the passive film was calculated from the obtained result. Further, in the oxygen concentration profile in the depth direction measured with AES, the depth at which the oxygen concentration is equal to ½ of the oxygen concentration value at the outermost surface is defined as the thickness of the passive film. The value of the thickness was calculated using the sputtering rate. The atomic ratio Cr/(Fe+Cr) and the thickness of the passive film were measured on five points for each sample, and determined by averaging the measurement results, respectively. Table 2 lists the measurement results together with the type of blank sheet used, and indicates whether surface treatment was performed.

<<Cell Performance>>

Finally, for each of the organic thin-film solar cells thus produced, the performances were evaluated as stated below. Firstly, measurement was made of the photocurrent-voltage characteristics of each organic thin-film solar cell using linear sweep voltammetry (LSV) in a state in which light irradiation was performed from the Au slit electrode side of the organic thin-film solar cell. The light used was simulated sunlight having a spectral distribution of AM 1.5 G with a light intensity of 100 mW/cm$^2$. From the measured photocurrent-voltage characteristics, energy conversion efficiency η (%), short circuit current ISC (mA), and fill factor FF were calculated. At that time, the effective area for the solar cell was set to 1.8 cm$^2$. The value of effective area was determined by multiplying 3.6 cm$^2$, which is the area of a region with an element structure of 1.5 cm×2.4 cm, by ½ in consideration of shielding on the Au slit electrode side. Further, for each of the organic thin-film solar cells using the stainless steel sheets as the substrates, the power generation performances were determined to be "Good" when the energy conversion efficiency η was 2.0% or higher and "Excellent" when r was 2.5% or higher. The evaluation results are listed in Table 2.

As presented in Table 2, those substrates satisfying the conditions of the disclosure, that is, specimen Nos. 1, 3, and 5, in which a stainless substrate was subjected to surface treatment so as to have an atomic ratio Cr/(Fe+Cr) of 0.08 or more on the surface of the passive film, exhibited power generation efficiency equivalent to that of the organic thin-film solar cell of specimen No. 7, in which ITO/glass was used as the substrate. Among these, the organic thin-film solar cells of Nos. 1 and 3, in which substrate A or B having a small arithmetic mean roughness Ra on the substrate surface was used, exhibited particularly good power generation performance.

It can be seen from the above results that the use of a substrate for a photoelectric conversion element satisfying the conditions of the disclosure makes it possible to reduce the material and manufacturing costs while maintaining power generation performance equivalent to that of the conventional ITO/glass substrate, and to facilitate handling during manufacture, transportation, and installation.

TABLE 1

| No. | Substrate material | Thickness/mm | Arithmetic mean roughness Ra/nm |
|---|---|---|---|
| A | SUS430 | 0.3 | 8 |
| B | SUS430 | 0.8 | 5 |
| C | SUS430 | 0.8 | 19 |

TABLE 2

| | | | Substrate | | | | | | |
|---|---|---|---|---|---|---|---|---|---|
| | | | | Passive film | | | | | |
| | | Surface | Atomic | Thick- | Cell performance | | | | |
| No. | Blank sheet | treatment | ratio Cr/(Fe + Cr) | ness/nm | η/% | ISC/mA | FF | Evaluation | Remarks |
| 1 | A | Performed | 0.23 | 1.6 | 2.62 | 15.9 | 0.56 | Excellent | Example |
| 2 | A | Not performed | 0.05 | 2.2 | 1.74 | 14.6 | 0.41 | Poor | Comparative Example |
| 3 | B | Performed | 0.09 | 2.1 | 2.81 | 16.8 | 0.56 | Excellent | Example |
| 4 | B | Not performed | 0.07 | 2.5 | 1.95 | 16.3 | 0.44 | Poor | Comparative Example |
| 5 | C | Performed | 0.21 | 1.6 | 2.18 | 16.2 | 0.48 | Good | Example |

TABLE 2-continued

| | Substrate | | Passive film | | Cell performance | | | | |
|---|---|---|---|---|---|---|---|---|---|
| Blank No. | sheet | Surface treatment | Atomic ratio Cr/(Fe + Cr) | Thickness/nm | $\eta$/% | ISC/mA | FF | Evaluation | Remarks |
| 6 | C | Not performed | 0.07 | 2.3 | 1.82 | 15.5 | 0.42 | Poor | Comparative Example |
| 7 | ITO/glass | — | — | — | 2.84 | 17 | 0.56 | — | Comparative Example |

REFERENCE SIGNS LIST

1 Organic thin-film solar cell
2 Hole collection layer
3 Au electrode (collector electrode)

The invention claimed is:

1. A substrate for a photoelectric conversion element, the substrate being made of a stainless steel sheet having a passive film on a surface thereof, wherein an atomic ratio Cr/(Fe+Cr) of the passive film on a surface thereof is 0.08 or more and 0.23 or less, and an arithmetic mean roughness Ra of the substrate for the photoelectric conversion element on a surface thereof is less than 10 nm.

2. The substrate for a photoelectric conversion element according to claim 1, wherein the passive film has a thickness of less than 2.3 nm.

\* \* \* \* \*